United States Patent
Tsao et al.

(10) Patent No.: US 9,141,744 B2
(45) Date of Patent: Sep. 22, 2015

(54) METHOD FOR GENERATING LAYOUT PATTERN

(71) Applicant: UNITED MICROELECTRONICS CORP., Hsin-Chu (TW)

(72) Inventors: Po-Chao Tsao, New Taipei (TW); Shih-Fang Hong, Tainan (TW); Chia-Wei Huang, Kaohsiung (TW); Ming-Jui Chen, Hsinchu (TW); Shih-Fang Tzou, Tainan (TW); Ming-Te Wei, Changhua County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/968,391

(22) Filed: Aug. 15, 2013

(65) Prior Publication Data

US 2015/0052491 A1    Feb. 19, 2015

(51) Int. Cl.
*G06F 17/50* (2006.01)
*G03F 1/00* (2012.01)

(52) U.S. Cl.
CPC ............ *G06F 17/5068* (2013.01); *G03F 1/144* (2013.01)

(58) Field of Classification Search
CPC .................................. G06F 17/50; G06F 9/455
USPC ............................................................ 716/55
See application file for complete search history.

(56) References Cited

U.S. PATENT DOCUMENTS

| 8,278,156 | B2 | 10/2012 | Pierrat |
| 8,312,394 | B2 | 11/2012 | Ban |
| 8,356,268 | B2 * | 1/2013 | Becker et al. ................. 716/126 |
| 2013/0334610 | A1 * | 12/2013 | Moroz et al. ................. 257/369 |

\* cited by examiner

*Primary Examiner* — Thuan Do
(74) *Attorney, Agent, or Firm* — Winston Hsu; Scott Margo

(57) ABSTRACT

A method for generating a layout pattern is provided. First, a layout pattern is provided to a computer system and is classified into two sub-patterns and a blank pattern. Each of the sub-patterns has pitches in simple integer ratios and the blank pattern is between the two sub-patterns. Then, a plurality of first stripe patterns and at least two second stripe patterns are generated. The edges of the first stripe patterns are aligned with the edges of the sub-patterns and the first stripe patterns have equal spacings and widths. The spacings or widths of the second stripe patterns are different from that of the first stripe patterns.

9 Claims, 6 Drawing Sheets

METHOD FOR GENERATING LAYOUT PATTERN

BACKGROUND OF THE INVENTION

1. Field of the Invention

The present invention generally relates to a method for generating layout pattern, and more particularly to a method for generating a layout pattern including FinFET layout pattern.

2. Description of the Prior Art

With the trend in the industry being towards scaling down the size of the metal oxide semiconductor field effect transistors (MOSFETs), three-dimensional or non-planar transistor technology, such as the fin field effect transistor (Fin FET) technology, has been developed to replace planar MOS transistors. Generally, patterned structures in a FinFET, such as fin structures, can be obtained by sidewall image transfer (SIT) through the following processes. First, a layout pattern is inputted into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate so as to obtain required patterned structures, such as stripe patterned structures, in the substrate.

However, the layout pattern and the patterned structures produced from the above processes still have limitations. For example, due to limitations in the design in layouts of circuits and restrictions on the fabrication processes, the patterned sacrificial layers are often distributed with the same spacing and of the same width. This configuration causes the subsequently formed strip patterned structures to be only distributed with the same spacing or with an integral multiple of that spacing. This arrangement will restrict not only the available area on the substrate but also the design in the layout of the circuit, which reduces the applicability of the semiconductor devices.

Consequently, there is a need to provide an improved method for generating a layout pattern so as to overcome the above-mentioned drawbacks.

SUMMARY OF THE INVENTION

One object of the present invention is to provide a method for generating a layout pattern so as to solve the problems of the conventional techniques.

According to one embodiment of the present invention, a method for generating a layout pattern is provided, which at least includes the following processes. First, a layout pattern is provided to a computer system and is classified into two sub-patterns and a blank pattern. Each of the sub-patterns has pitches in simple integer ratios and the blank pattern is between the two sub-patterns. Then, a plurality of first stripe patterns and at least two second stripe patterns are generated. The edges of the first stripe patterns are aligned with the edges of the sub-patterns and the first stripe patterns have equal spacings and widths. The spacings or widths of the second stripe patterns are different from that of the first stripe patterns. Finally, the first stripe patterns and the second stripe patterns are outputted to a photomask.

According to another embodiment of the present invention, a method for generating a layout pattern comprising a FinFET structure layout is provided, which at least includes the following processes. First, a layout pattern, which includes a sub-pattern having pitches in simple integer ratios, is provided to a computer system. The sub-pattern is then classified into a first sub-pattern and a second sub-pattern. Afterwards, a plurality of first stripe patterns and at least one second stripe pattern are generated. The edges of the first stripe patterns are aligned with the edges of the first sub-pattern and the first stripe patterns have equal spacings and widths. The edges of the second stripe pattern are aligned with the edges of the second sub-pattern and the widths of the second stripe pattern are different from the widths of the first stripe patterns. Finally, the first stripe patterns and the second stripe pattern are outputted to a photomask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
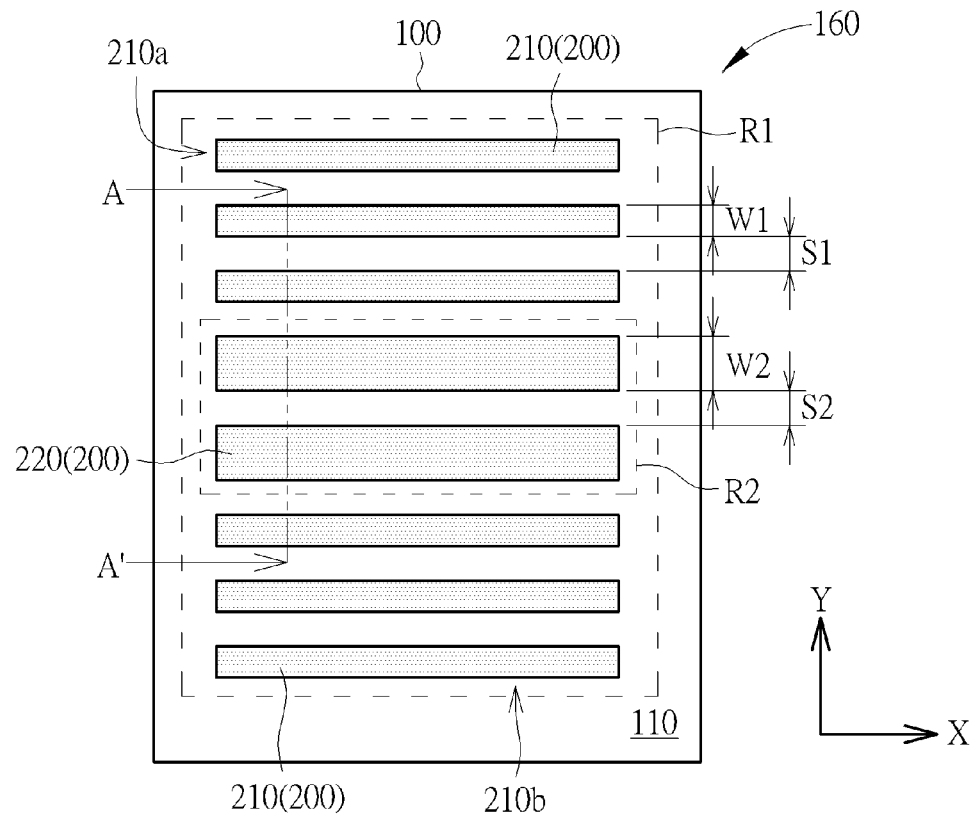
FIG. 1 to FIG. 11 are schematic diagrams showing a method for generating a layout pattern and for fabricating patterned structure by sidewall image transfer (SIT) according to embodiments of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
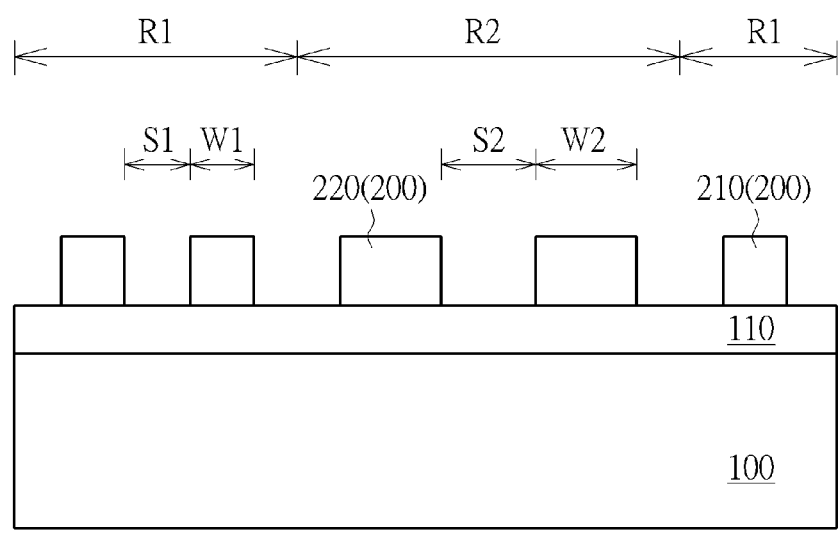
Figure 4:
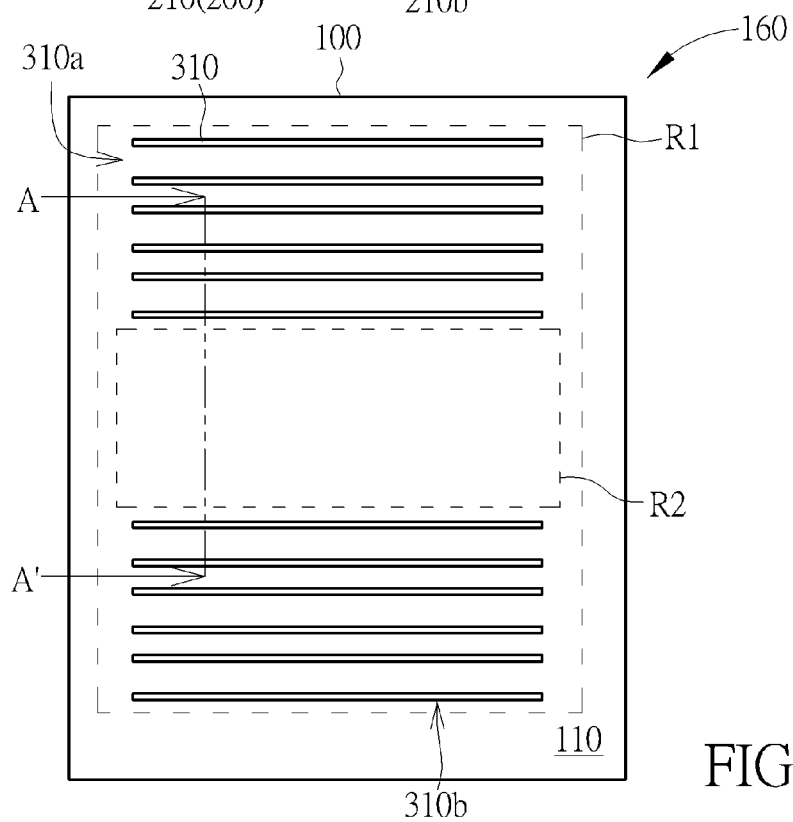
Figure 5:
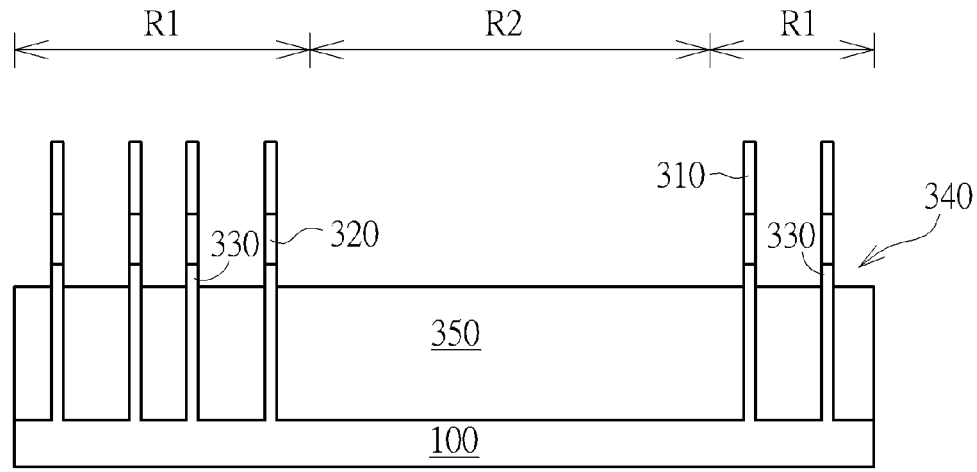
Figure 6:
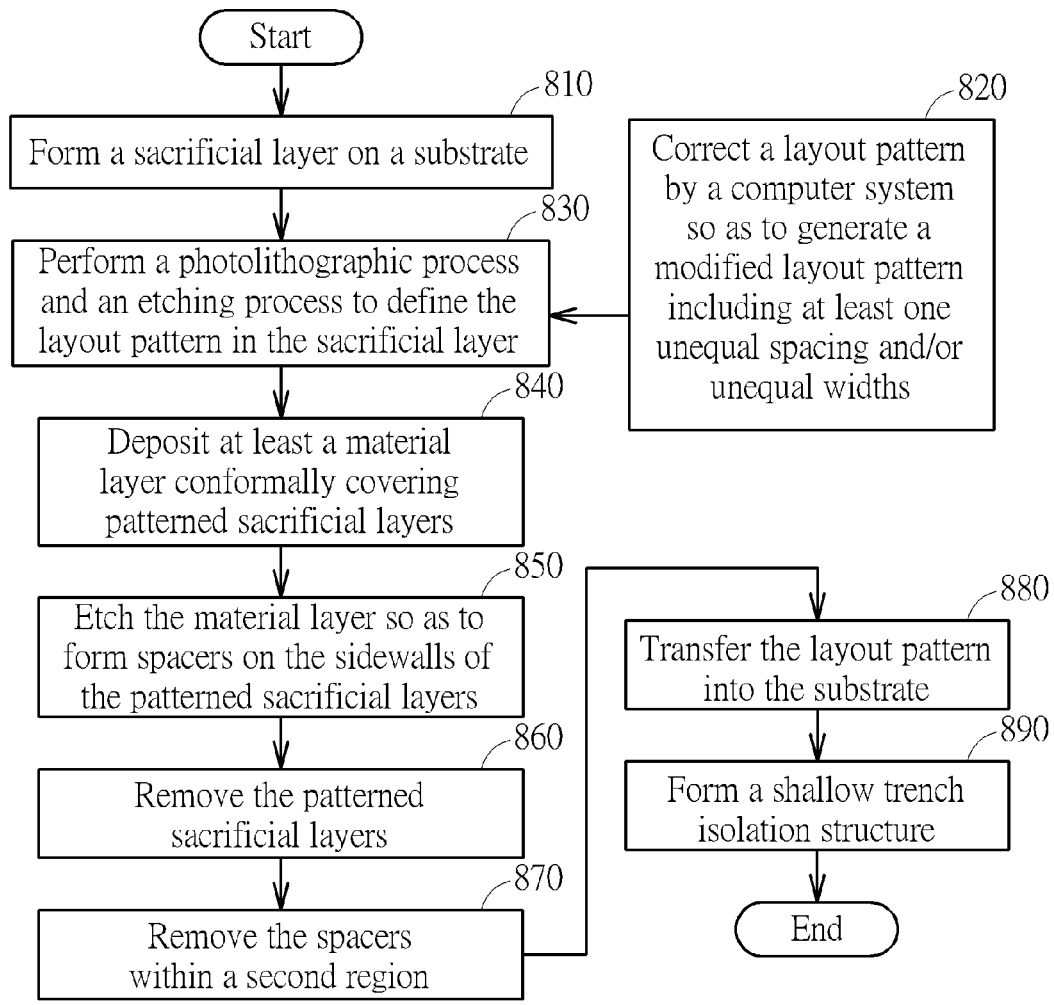
Figure 7:
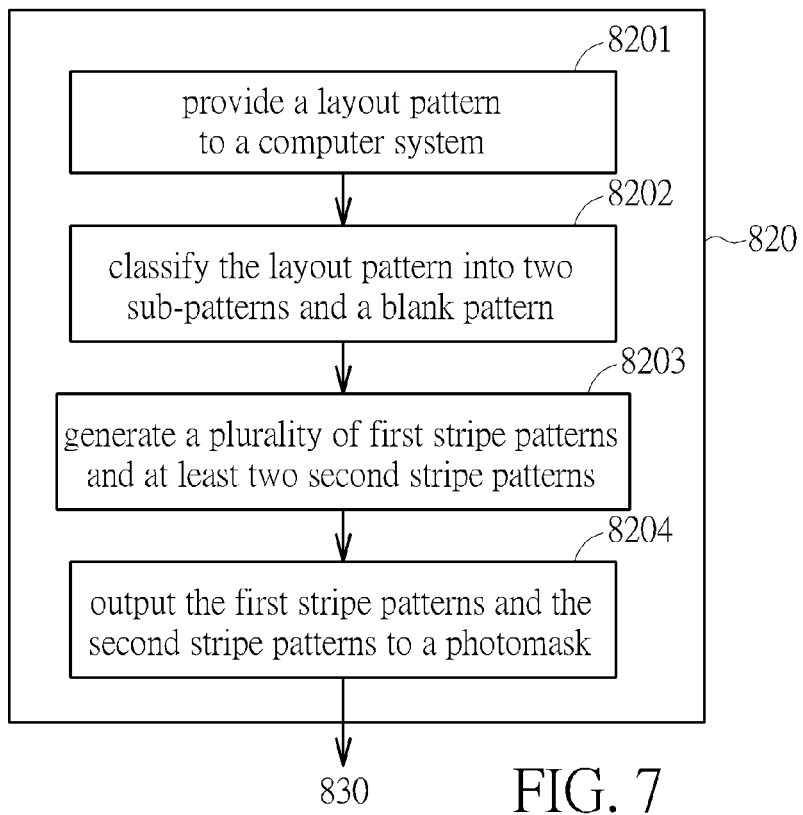

Please refer to FIGS. 1 to 7. FIGS. 1 to 7 are schematic, cross-sectional diagrams showing a method for generating a layout pattern and for fabricating a patterned structure according to a first embodiment of the present invention. FIG. 6 is a corresponding flow chart. As shown in FIGS. 1 and 2, a step 810 is carried out, in which a substrate 100 with a sacrificial layer (not shown) on its surface is provided. According to the present embodiment, a pad layer 110 may be further disposed between the sacrificial layer and the substrate 100.

The substrate 100 may be a semiconductor substrate (such as a silicon substrate), a silicon containing substrate (such as a silicon carbide substrate), a III-V group-on-silicon (such as GaN-on-silicon) substrate, a graphene-on-silicon substrate, a silicon-on-insulator (SOI) substrate or an epitaxial layer containing substrate. The pad layers 110 are made of a dielectric layer, such as silicon oxide layer or a silicon nitride layer, but not limited thereto. The sacrificial layer may be made of silicon material, III-V group semiconductors or other suitable semiconductor materials, and preferably be made of polysilicon material.

After the previous processing stage, a step 820 is then carried out. In this step, a layout pattern may be provided to and modified by a computer system installed with a suitable simulation software. Through this modification process, a modified layout pattern including at least one unequal spacing and/or unequal widths may be generated. Afterwards, the modified layout pattern may be outputted to a photomask. Please refer to FIG. 6 and FIG. 7. The previous modification process, for example, step 8201 and 8202 may be carried out sequentially where a layout pattern can be provided to and classified in a computer system. The layout pattern includes a FinFET structure layout and can be classified into two sub-patterns and a blank pattern. Each of the sub-patterns have pitches in simple integer ratios and the blank pattern is between the two sub-patterns. Afterwards, in step 8203 and 8204, a plurality of first stripe patterns and at least two second stripe patterns are generated through an optical proximity correction (OPC) process. The edges of the first stripe patterns are aligned with the edges of the sub-patterns and the first stripe patterns have equal spacings and widths. The spacings or widths of the second stripe patterns are different from that of the first stripe patterns. Finally, the first stripe patterns and the second stripe patterns are outputted to a photomask. It should be noted that specific features of the above-mentioned layout pattern, the first stripe patterns and the second stripe patterns are substantially depicted in FIG. 3 and FIG. 4 and are described in detail in the following paragraphs. Besides, the timing for performing the step 820 is not restricted to be processed after step 810, it may also be performed prior to or concurrently with step 810.

Afterwards, in step 830, a layout pattern proportional to the layout pattern defined in the photomask can be transferred to the sacrificial layer through a photolithographic process and an etching process. Through these processes, the structure shown in FIG. 1 and FIG. 2 may be obtained. According to the present embodiment, a layout pattern 160 is composed of a patterned sacrificial layer 200, which includes a plurality of first stripe patterns 210 and at least a second stripe pattern 220 respectively located in a first region R1 and a second region R2 of the substrate 100. More precisely, the second region R2 may be regarded as a region within the first region R1. The first region R1 and the second region R2 may be respectively used as a device region and an isolation region to accommodate semiconductor devices and isolation structures, but not limited thereto. The appearance of the first stripe patterns 210 and the second stripe pattern 220 may be strip-shaped, and all of or parts of their long axes may be parallel to one another or may be inclined toward one another with an acute or an obtuse angle. For example, the long axes of all the first stripe patterns 210 and the second stripe pattern 220 are preferably aligned along a first direction X and both the first and the second stripe patterns 210/220 are arranged along a second direction Y.

According to the present embodiment, each first stripe pattern 210 has the equal spacings and widths. That is to say, each first stripe pattern 210 has a first width W1 and there is a first spacing S1 between two adjacent first stripe patterns 210, while each second stripe pattern 220 has a second width W2 and there is a second spacing S2 between two adjacent second stripe patterns 220. Preferably, at least the width and/or the spacing of the second stripe patterns 220 differ from that of the first stripe patterns 210. In other words, at least one of the widths and the spacing of the second stripe patterns 220 are equal to that of the first stripe patterns 210. For example, in a case where the width of each of the first stripe patterns 210 is different from that of each of the second stripe patterns 220, that is, the first width W1 is unequal to the second width W2, the spacing between two adjacent first stripe patterns 210 is preferably equal to that between two adjacent second stripe patterns 220. In another case where the spacing between two adjacent first stripe patterns 210 is unequal to that between two adjacent second stripe patterns 220, that is, the first spacing S1 is unequal to the second spacing S2, the width of each of the first stripe patterns 210 is preferably equal to that of each of the second stripe patterns 220, but not limited thereto. In addition, both the width and the spacing of the second stripe patterns 220 may differ from those of the first stripe patterns 210. It should be noted that the technical term "pitch" means a distance between central longitudinal axes respectively in two adjacent stripe patterns while the technical term "spacing" is a distance measured between two opposite sidewalls of two adjacent stripe patterns.

More precisely, the first stripe patterns 210 may be grouped into at least two clusters, such as a first cluster 210a and a second cluster 210b, while a single or a group of second stripe patterns 220 may be grouped into another cluster (not shown). In this way, the first cluster 210a and the second cluster 210b may be at least at one side of the cluster composed of the second stripe patterns 220. According to the present embodiment, first cluster 210a and the second cluster 210b are respectively at two sides of the cluster composed of the second stripe patterns 220 such that the second stripe patterns 220 are between the first cluster 210a and the second cluster 210b. Preferably, the spacing between the first cluster 210a and the second clusters 210 is less than 5 times the width of the each of the first stripe patterns 210, but not limited thereto.

Figure 3:
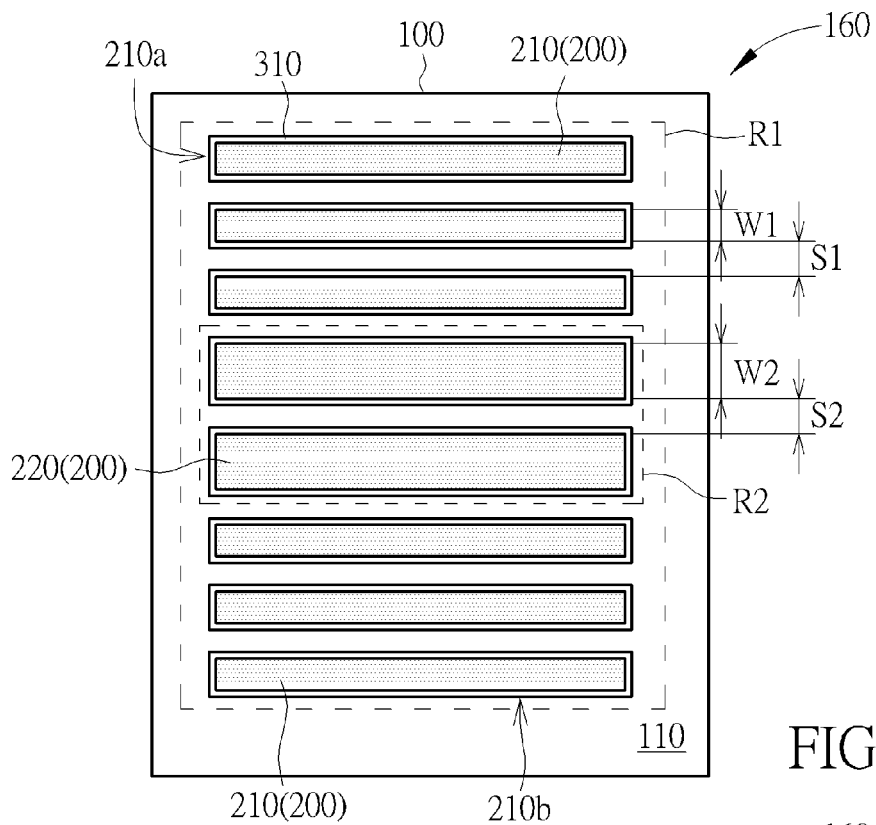

Please refer to FIG. 3. Processes corresponding to steps 840/850 are carried out so that spacers 310 may be formed on the sidewalls of the first stripe patterns 210 and the second stripe patterns 220. The process for forming the spacers 310 may include the following steps. First, at least a material layer (not shown) is formed to conformally cover each of the sacrificial layers 200 (that is the first stripe patterns 210 and the second stripe patterns 220). Afterwards, an etching process is carried out to blank etch material layer until the first stripe patterns 210 and the second stripe patterns 220 are exposed. At this time, spacers 310 with the same width may be formed on the sidewalls of the first stripe patterns 210 and the second stripe patterns 220, but not limited thereto. The above-mentioned material layer may be, for example, silicon nitride, silicon oxide, silicon oxynitride, silicon carbide or the like. It should be noted that the second stripe patterns 220 in the second region R2 may also be removed before executing step 840/850, but not limited thereto.

More precisely, under a specific etching recipe, different etching rates may be obtained for the substrate 100, the pad layer 110, the patterned sacrificial layer 200 and the material layer. For example, the etching rate of the material layer is higher than that of the patterned sacrificial layer 200 and the pad layer 110 under one etching recipe; the etching rate of the patterned sacrificial layer 200 is higher than that of the material layer and the pad layer 110 under another etching recipe; under still another same etching recipe, the etching rate of the pad layer 10 is higher than that of the material layer. Additionally, other choices for the etching rates of these materials may still be possible.

Refer now to FIG. 4; each patterned sacrificial layers and the spacers within the predetermined region are further removed through steps 860/870 so as to obtain the layout pattern including FinFET structure layout as disclosed in step 820. More precisely, the layout pattern 160 includes two sub-patterns 310a and 310b and a blank pattern. Each of the sub-patterns 310a and 310b has pitches in simple integer ratios and the blank pattern is between the two sub-patterns 310a and 310b (that is, the blank pattern is within the second region R2). Furthermore, the blank pattern between the sub-patterns 310a and 310b has a distance and the ratio of this distance to the pitch of the sub-patterns 310a and 310b is not integral. It should be noted that, in step 820, the longitudinal edges of the sub-patterns 310a and 310b are aligned with the longitudinal edges of the first stripe patterns 210, while a position of the blank pattern corresponds to a position of the second stripe patterns 220. More precisely, in step 860/870, an etching process, such as a wet etching process, may be first carried out to remove each first stripe patterns 210 and each second stripe patterns 220. A photolithographic and an etching process may be then performed to optionally remove the spacers at two ends of the first stripe patterns 210, or to further remove the spacers in the second region R2. In a case where all the spacers at two ends of the first stripe patterns 210 are removed, several stripe spacers being parallel to one another may be therefore formed. It should be noted that steps 860/870 may also be executed in a reverse order if required.

Please refer to FIG. 5, which is a cross-sectional diagram approximately corresponding to a diagram taken along line A-A' in FIG. 4. After the previous processes, other subsequent processes in the sidewall image transfer (SIT) method can be carried out. Through the SIT method, the layout pattern defined by the spacers 310 may be consecutively transferred to the pad layer 110 and the substrate 100. For example, step 880 may be performed first. In step 880, an etching process may be carried out by using the spacers 310 as an etch mask such that a patterned pad layer 320 is formed. In addition, by performing the same or another etching process, a plurality of patterned structures 330, also called fin structures, are further formed in the substrate and are surrounded by shallow trenches 340. Subsequently, step 890 is carried out in which an insulating layer 350 is blank deposited on the substrate 100 so as to fill up each shallow trench 340 and cover the spacers 310, patterned pad layer 320 and patterned structures 330. Afterwards, a polishing process and an etching back process are carried out to planarize and lower the insulating layer 350 until a top surface of each patterned structures 330 protrudes from the insulating layer 350 as shown in FIG. 5. The process utilized to form the insulating layer 350 includes a high density plasma CVD (HDPCVD) process, a sub atmosphere CVD (SACVD) process, a spin on dielectric (SOD) process or a flowable chemical vapor deposition (FCVD) process, but not limited thereto. Finally, the spacers 310 and the patterned pad layer 320 are removed so as to obtain the patterned structure corresponding to the present embodiment.

At this time, the main patterned structure according to the present embodiment is obtained. In the subsequent fabricating processes, the patterned structure 330 in the first region R1 may be used as a component of a semiconductor device, such as a channel region for charge carriers in a memory device, while the insulating layer 350 in the second region R2 may be used as a shallow trench isolation structure (STI) to electrically isolate semiconductor devices at its two sides. By applying the processes disclosed in the present embodiment, since the second stripe patterns 220 in the second region R2 have different width and/or spacing from those of the first stripe patterns 210, the dimension of the shallow trench isolation structure in the second region R2, as well as the distance between two adjacent semiconductor devices, can be all reduced. In other words, the areas occupied by the redundancy shallow trench isolation structure can be minimized thanks to the layout with the unequal spacings and/or unequal widths. Accordingly, the entire substrate 100 can be utilized more effectively.

In the following paragraph, various embodiments about patterned structures are disclosed and the description below is mainly focused on differences among each embodiment. In addition, like or similar features will usually be described with same reference numerals for ease of illustration and description thereof.

Figure 8:
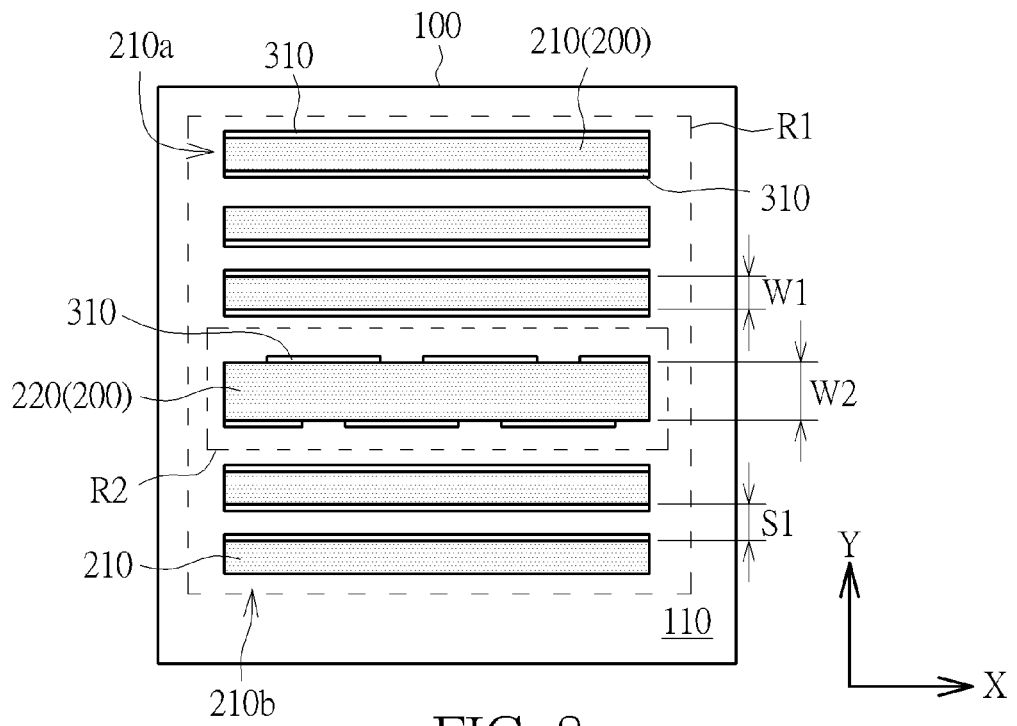
Figure 9:
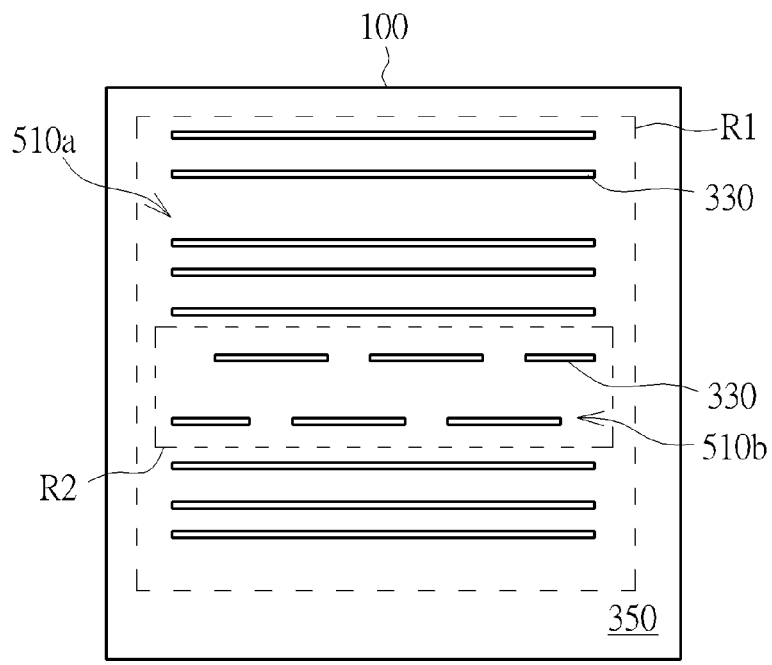
Figure 10:
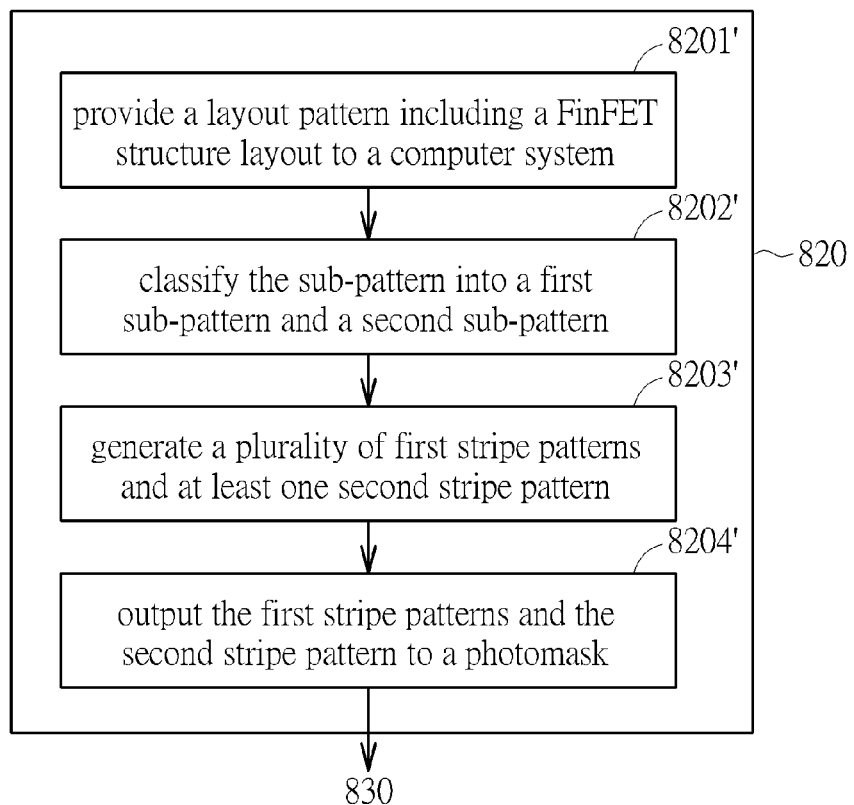

Please refer to FIGS. 8 and 9 accompanied with FIG. 10. FIG. 8 and FIG. 9 are schematic, cross-sectional diagrams showing a method for generating a layout pattern and for fabricating a patterned structure according to a second preferred embodiment of the present invention. FIG. 10 is a corresponding flow chart. Similarly to the above embodiment, step 820 is also carried out in this embodiment so as to obtain required layout pattern. However, sub-steps of the step 820 disclosed in this embodiment are slightly different from that disclosed in the previous embodiment. Referring to FIG. 10, for example, a layout pattern is provided to and classified in a computer system through step 8201' and 8202'. The layout pattern includes a FinFET structure layout and may be classified into a first sub-pattern and a second sub-pattern. The sub-pattern has pitches in simple integer ratios. Afterwards, in step 8203' and 8204', a plurality of first stripe patterns and at least one second stripe pattern are generated through an optical proximity correction (OPC) process. The longitudinal edges of the first stripe patterns are aligned with the longitudinal edges of the first sub-patterns and the first stripe patterns have equal spacings and widths. The longitudinal edges of the second stripe pattern are aligned with the longitudinal edges of the second sub-pattern and the widths of the second stripe pattern are different from the widths of the first stripe patterns. Finally, the first stripe patterns and the second stripe pattern are outputted to a photomask. It should be noted that specific features of the above-mentioned layout pattern, the first stripe patterns and the second stripe pattern are substantially depicted in FIG. 8 and FIG. 9 and are described in detail in the following paragraphs. Similarly, the timing for performing the step 820 is not restricted to be processed after step 810, it may also be performed prior to or concurrently with step 810.

Referring back to FIG. 8, step 830 is then performed. More precisely, the layout pattern may be transferred from the photomask to a layer of the sacrificial layer on the substrate 100 through the photolithographic process and the etching process. In this way, the patterned sacrificial layers 200 with the predetermined layout pattern may be formed. Similarly to the previous embodiment, the patterned sacrificial layers 200 may include a plurality of first stripe patterns 210 and at least a second stripe pattern 220 respectively located in the first region R1 and the second region R2 of the substrate 100. More precisely, the second region R2 may be regarded as a region within the first region R1. Both the first region R1 and the second region R2 may be used as device regions to accommodate semiconductor devices, but not limited thereto. The appearance of the first stripe patterns 210 and the second stripe pattern 220 may be stripe-shaped, and all of, or parts of, their long axes may be parallel to one another or may be inclined toward one another with an acute or obtuse angle. For example, the long axes of all the first stripe patterns 210 and the second stripe pattern 220 are preferably aligned along the first direction X and both the first and the second stripe patterns 210/220 are arranged along the second direction Y.

According to the present embodiment, each first stripe pattern 210 has a first width W1 and there is a first spacing S1 between two adjacent first stripe patterns 210, while the second stripe patterns 220 has a second width W2. Preferably, the width of the second stripe pattern 220 is different from that of each first stripe pattern 210. More preferably, the width of the second stripe pattern 220 is substantially the sum of the first width and first spacing. Compared with a conventional structure wherein only strip patterns with equal widths can be provided, the widened second stripe pattern 220 disclosed in the present embodiment enables portions of the spacers 310 to be respectively formed on the two sidewalls of the same second stripe pattern 220. In this way, even if variation in the spacing occurs, it does not alter the locations of the spacers 310 and the patterned structures can be formed more precisely.

Similarly, the first stripe patterns 210 may also be grouped into at least two clusters, such as the first cluster 210a and the second cluster 210b, while a single or a group of second stripe patterns 220 may be grouped into another cluster (not shown). In this way, the first cluster 210a and the second cluster 210b may be at least at one side of the cluster composed of the second stripe patterns 220. According to the present embodiment, the first cluster 210a and the second cluster 210b are respectively at two sides of the cluster composed of the second stripe patterns 220 such that the second stripe patterns 220 are between the first cluster 210a and the second cluster 210b. Spacers 310 may be formed on the sidewalls of the first stripe patterns 210 and the second stripe pattern 220. Additionally, each of the spacers 310 on the sidewalls of the second stripe pattern 220 may be discontinuous.

Please refer to FIG. 9. After the previous processes, other subsequent processes in the sidewall image transfer (SIT) method can be carried out so as to obtain the layout pattern including FinFET structure layout as disclosed in step 820. More precisely, the layout pattern 160 may include a first sub-pattern 510a and a second sub-pattern 510b with pitches in simple integer ratios. It should be noted that, in step 820, the longitudinal edges of the first sub-pattern 510a are aligned with the longitudinal edges of the first stripe patterns 210, while the longitudinal edges of the second sub-pattern 510b are aligned with the longitudinal edges of the second stripe pattern 220. In other words, the two longitudinal edges of the second stripe pattern 220 are respectively aligned with the longitudinal edges of the second sub-pattern 510b.

More precisely, the structure shown in FIG. 9 may be fabricated through implementing step 880/890. For example, an etching process may be carried out, such that a patterned pad layer is formed. In addition, by performing the same or another etching process, a plurality of patterned structures 330, also called fin structures, are further formed in the substrate and are surrounded by shallow trenches. In the subsequent process, the formation of the shallow trench isolation structure or other required structure may be further carried out. Since the following processes are similar to those disclosed in the first preferred embodiment, the detailed description of those is therefore omitted. It should be noted that the layout pattern disclosed in the present embodiment corresponds to a SRAM structure composed of six FETs (6T-SRAM). Since a process for fabricating the SRAM is not main features of the present invention, it is therefore omitted for the sake of brevity.

Through the process disclosed in the present embodiment, the second stripe pattern 220 in the second region R2 may has a width wider than the width of the first stripe patterns 210 and is preferably equal to the sum of the first width and first spacing of the first stripe patterns 210. By providing the widened second stripe pattern 220, portions of the spacers 310 may be respectively formed on the two sidewalls of the same second stripe pattern 220. In this way, even if there is line-to-line spacing variation in the patterned sacrificial layers 200, it does not alter the locations of the spacers 310 and the patterned structure can be formed more precisely.

Figure 11:
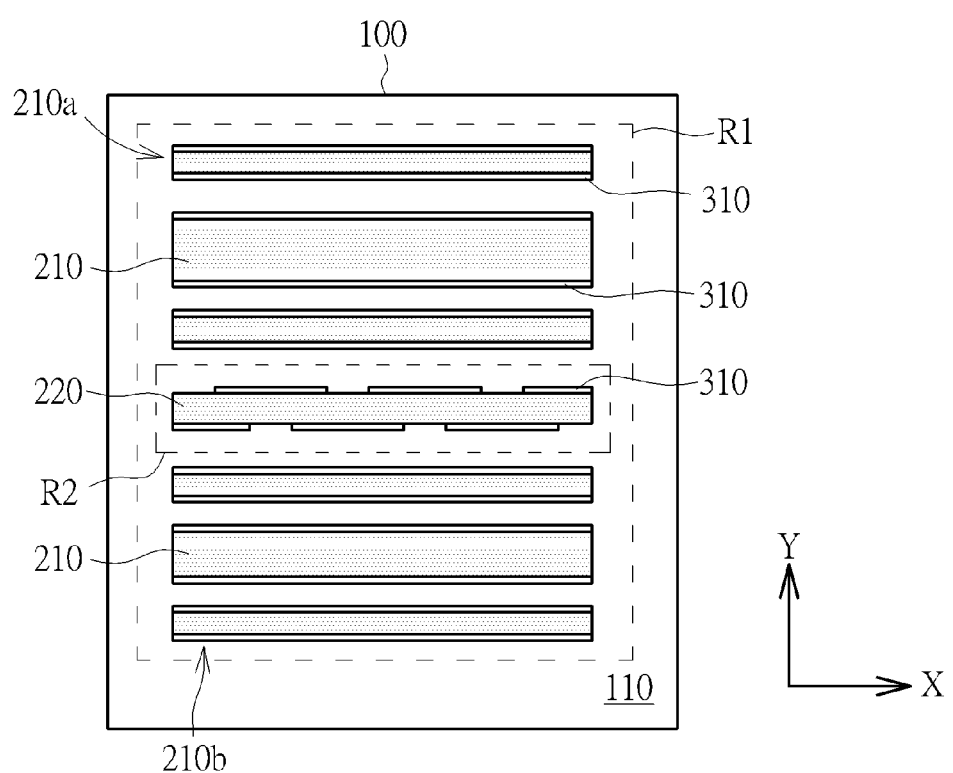

Please refer to FIG. 11. FIG. 11 is a modification of the previous second preferred embodiment. One main difference between these two embodiments is that the first clusters 210a and/or the second clusters 210b disclosed in this modification include at least one first stripe pattern 210 with unequal width. By providing the widened first stripe pattern 210, portions of the spacers 310 may be respectively formed on the two sidewalls of the same first stripe pattern 210. In this way, even if there is line-to-line spacing variation in the patterned sacrificial layers 200, it does not alter the locations of the corresponding spacers 310 and the patterned structure can be formed more precisely. Since structure and process disclosed in the present modification are similar to those disclosed in the second preferred embodiment, the detailed description of those is therefore omitted.

It should be understood that the embodiments are capable of being used in various other combinations, modifications, and environments. In other words, they are able to be changed or modified within the concepts expressed herein. For example, by adopting the spirit disclosed in the second preferred embodiment and its modification, the width of at least one of the second stripe patterns may be greater than that of the first stripe patterns, and the first cluster and/or the second cluster within the first region may include at least one first stripe patter having unequal width, but not limited thereto.

It should also be noted that, although the patterned structures disclosed in the previous embodiments mostly suit the non-planar field effect transistors, it should not be used to limit the scope the present invention. Without departing from the scope and spirit of the present invention, they could be applied to any patterned structures or devices with relatively high density and integration, such as conductive structures, interconnections and so forth.

In summary, the embodiments of the present invention provide a method for fabricating a patterned structure by a sidewall image transfer. Since first stripe patterns and/or second stripe patterns may have unequal width and/or spacing, the size of certain structure, such as shallow trench isolation structure, may be reduced and the influence of spacing deviation on the locations of patterned structure may be minimized. Accordingly, even if there is line-to-line spacing variation in the patterned sacrificial layers, it does not alter the locations of the corresponding spacers and the patterned structure can be formed more precisely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating a layout pattern comprising a FinFET structure layout, the method comprising:
   providing a layout pattern to a computer system, wherein the layout pattern comprises a sub-pattern;
   classifying the sub-pattern into a first sub-pattern and a second sub-pattern by the computer system;
   generating a plurality of first stripe patterns, wherein longitudinal edges of the first stripe patterns are aligned with longitudinal edges of the first sub-pattern by the computer system;
   generating at least one second stripe pattern by the computer system, wherein longitudinal edges of the second stripe pattern are aligned with longitudinal edges of the second sub-pattern, and widths of the second stripe pattern are different from the widths of the first stripe patterns; and
   outputting the first stripe patterns and the second stripe pattern to a photomask by the computer system.

2. The method according to claim 1, wherein the sub-pattern further comprises another first sub-pattern, and the first sub-pattern and the another first sub-pattern are respectively disposed at two sides of the second stripe pattern.

3. The method according to claim 1, wherein the first stripe patterns are at least respectively disposed at two sides of the second stripe pattern.

4. The method according to claim 1, wherein each of the first stripe patterns and the second stripe pattern respectively have long axes, and the long axes are parallel to one another.

5. The method according to claim 1, wherein the first stripe patterns have first spacings and first widths, and the widths of the second stripe pattern are substantially equal to a sum of the first spacing and the first width.

6. The method according to claim 1, wherein two longitudinal edges of the second stripe pattern are respectively aligned with the longitudinal edges of the second sub-pattern.

7. The method according to claim 1, further comprising performing an optical proximity correction to determine the widths of the second stripe pattern.

8. The method according to claim 1, wherein the sub-pattern has pitches in simple integer ratio.

9. The method according to claim 1, wherein the first stripe patterns have equal spacings and widths.

* * * * *